United States Patent
Atkinson et al.

(10) Patent No.: US 9,576,791 B2
(45) Date of Patent: Feb. 21, 2017

(54) SEMICONDUCTOR DEVICES INCLUDING SEMICONDUCTOR STRUCTURES AND METHODS OF FABRICATING THE SAME

(71) Applicant: GM GLOBAL TECHNOLOGY OPERATIONS LLC, Detroit, MI (US)

(72) Inventors: Craig J. Atkinson, Sheridan, IN (US); Alireza Amirrezvani, Noblesville, IN (US); Nicole C. Skaggs, Highland, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 14/726,999

(22) Filed: Jun. 1, 2015

(65) Prior Publication Data

US 2016/0351384 A1 Dec. 1, 2016

(51) Int. Cl.
  *H01L 29/66* (2006.01)
  *H01L 21/02* (2006.01)
  *H01L 29/872* (2006.01)
  *H01L 29/861* (2006.01)

(52) U.S. Cl.
  CPC ..... *H01L 21/0217* (2013.01); *H01L 21/02274* (2013.01); *H01L 29/66136* (2013.01); *H01L 29/66143* (2013.01); *H01L 29/8613* (2013.01); *H01L 29/872* (2013.01)

(58) Field of Classification Search
  CPC ............. H01L 21/027; H01L 21/02274; H01L 29/66136; H01L 29/872; H01L 21/0217
  See application file for complete search history.

(56) References Cited

U.S. PATENT DOCUMENTS

| | | | | |
|---|---|---|---|---|
| H665 H | * | 8/1989 | Knolle | H01L 23/647 257/630 |
| 5,374,843 A | * | 12/1994 | Williams | H01L 23/585 257/335 |
| 5,508,067 A | * | 4/1996 | Sato | C23C 16/30 257/E21.269 |
| 5,523,616 A | * | 6/1996 | Den | H01L 23/3171 257/637 |
| 6,346,444 B1 | * | 2/2002 | Park | H01L 29/402 257/E21.358 |
| 2002/0011639 A1 | * | 1/2002 | Carlson | H01L 27/146 257/443 |
| 2005/0233595 A1 | * | 10/2005 | Choi | C23C 16/345 438/778 |
| 2007/0051979 A1 | * | 3/2007 | Kambayashi | H01L 23/3171 257/194 |

(Continued)

OTHER PUBLICATIONS

Osenbach, John W., et al., "Semi-Insulating Silicon Nitride (SinSiN) as a Resistive Field Shield," IEEE Transaction on Electron Devices, Jun. 1990, pp. 1522-1528, vol. 37, No. 6.

(Continued)

*Primary Examiner* — Yosef Gebreyesus
(74) *Attorney, Agent, or Firm* — Lopenz & Kopf, LLP

(57) ABSTRACT

Semiconductor devices and methods for fabricating semiconductor devices are provided. In one example, a semiconductor device includes a semiconductor structure. An electrically semi-insulating passivation layer overlies the semiconductor structure. An electrically substantially fully insulating passivation layer overlies the electrically semi-insulating passivation layer.

20 Claims, 4 Drawing Sheets

(56) References Cited

U.S. PATENT DOCUMENTS

| | | | |
|---|---|---|---|
| 2009/0166815 A1* | 7/2009 | Makiyama | H01L 21/28264 257/640 |
| 2012/0068310 A1* | 3/2012 | Uemura | H01L 29/0619 257/577 |
| 2015/0303398 A1* | 10/2015 | Ii | H01L 51/442 257/40 |

OTHER PUBLICATIONS

Schlegel, Earl S., et al., "Behavior of Surface Ions on Semiconductor Devices," IEEE Transactions on Electron Devices, Dec. 1968, pp. 973-979, vol. ED-15, No. 12.

Matsuzaki, K., et al., "Application of a Semi-insulating Amorphous Hydrogenated Silicon Nitride Film as a Resistive Field Shield and Its Reliability," J. Electrochem. Soc., Dec. 1998, vol. 145, No. 12.

* cited by examiner

SEMICONDUCTOR DEVICES INCLUDING SEMICONDUCTOR STRUCTURES AND METHODS OF FABRICATING THE SAME

TECHNICAL FIELD

The technical field relates generally to semiconductor devices, and more particularly relates to semiconductor devices including a semiconductor structure such as a fast recovery diode having, for example, a stable reverse bias breakdown voltage and methods for fabricating such semiconductor devices.

BACKGROUND

Semiconductor devices including fast recovery diodes ("FREDs") are well-known and are a hybrid of Schottky diodes and P-N junction diodes. This arrangement produces a lower forward voltage drop at higher currents, along with a higher switching speed than is available in only a P-N junction diode or a Schottky diode. It is desirable when switching from current passing mode (when a semiconductor device is forward biased) back to current blocking mode (when the semiconductor device is reverse biased) that the required reverse voltage can be achieved quickly and that this voltage remains stable once achieved.

It is important for fast recovery diodes to have a stable reverse bias breakdown voltage (reverse bias breakdown voltage is also sometimes referred to as blocking voltage) to ensure the performance and reliability of the semiconductor device. Unfortunately, some fast recovery diodes, especially those being used in relatively high voltage applications (e.g., about 500 V or greater (e.g., about 500 V to about 2000 V)), can have reverse bias breakdown voltages that can change or become unstable, for example, when the diode is exposed to moisture (e.g. high humidity conditions for example greater than about 60% relative humidity) and/or when trace amounts of ionic contamination (e.g., sodium or the like) are present on the surface layer of the diode or the like semiconductor structure. In particular, when a negative voltage bias is applied, for example, to the main anode of some fast recovery diodes in the presence of high humidity, dormant surface charges on the exterior of the diode can become mobile and pool together to create localized pockets of electric fields in undesirable locations that can alter the depletion zones of the dopant tubs or wells of the diode, causing a reduction (e.g., "walk-in" effect), for example, in the reverse bias breakdown voltage, thereby detrimentally affecting the performance and reliability of the semiconductor device. Additionally, in some cases when the device is not packaged and/or is not in a controlled low humidity environment, the degrading effect of moisture on the reverse bias breakdown voltage can be more severe. Therefore, the testing conditions for the device should be considered when determining the magnitude of these effects on the device.

Accordingly, it is desirable to provide semiconductor devices including semiconductor structures such as fast recovery diodes or the like that have a stable reverse bias breakdown voltage, for example, even in the presence of moisture, to improve the performance and reliability of the semiconductor device and methods for fabricating such semiconductor devices. Furthermore, other desirable features and characteristics will become apparent from the subsequent detailed description and the appended claims, taken in conjunction with the accompanying drawings and this background.

BRIEF SUMMARY

Semiconductor devices and methods for fabricating semiconductor devices are provided herein. In accordance with an exemplary embodiment, a semiconductor device includes a semiconductor structure. An electrically semi-insulating passivation layer overlies the semiconductor structure. An electrically substantially fully insulating passivation layer overlies the electrically semi-insulating passivation layer.

In accordance with another exemplary embodiment, a semiconductor device is provided. The semiconductor device includes a semiconductor structure configured as fast recovery diode structure and includes a doped semiconductor substrate of an N conductivity type. The doped semiconductor substrate has an upper surface portion and a lower surface portion that is disposed on a side opposite the upper surface portion. The doped semiconductor substrate includes a central P+ dopant region of a P conductivity type extending to the upper surface portion defining a main anode. A termination N+ dopant region of the N conductivity type surrounds the upper surface portion to define a channel stop. At least one intermediate P+ dopant region of the P conductivity type is disposed in the upper surface portion between and spaced apart from the main anode and the channel stop to define at least one guard ring. A lower N+ dopant region of the N conductivity type is formed in the lower surface portion of the doped semiconductor substrate. A first anode metal pad is electrically coupled to the main anode and a second metal structure is electrically coupled to the channel stop. At least one oxide layer overlies the doped semiconductor substrate between the first anode metal pad and the second metal structure. At least one metal field plate is disposed between and spaced apart from the first anode metal pad and the second metal structure overlying the at least one oxide layer. An electrically semi-insulating passivation layer includes a first silicon nitride material overlying the at least one metal field plate and the at least one oxide layer. The first silicon nitride material has a first bulk resistivity of from about $7.5 \times 10^8$ to about $2.5 \times 10^9$ Ohm·cm. An electrically substantially fully insulating passivation layer includes a second silicon nitride material overlying the electrically semi-insulating passivation layer. The second silicon nitride material has a second bulk resistivity of from about $1 \times 10^{15}$ to about $1 \times 10^{16}$ Ohm·cm.

In accordance with another exemplary embodiment, a method for fabricating a semiconductor device is provided. The method includes forming an electrically semi-insulating passivation layer overlying a semiconductor structure. An electrically substantially fully insulating passivation layer is formed overlying the electrically semi-insulating passivation layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
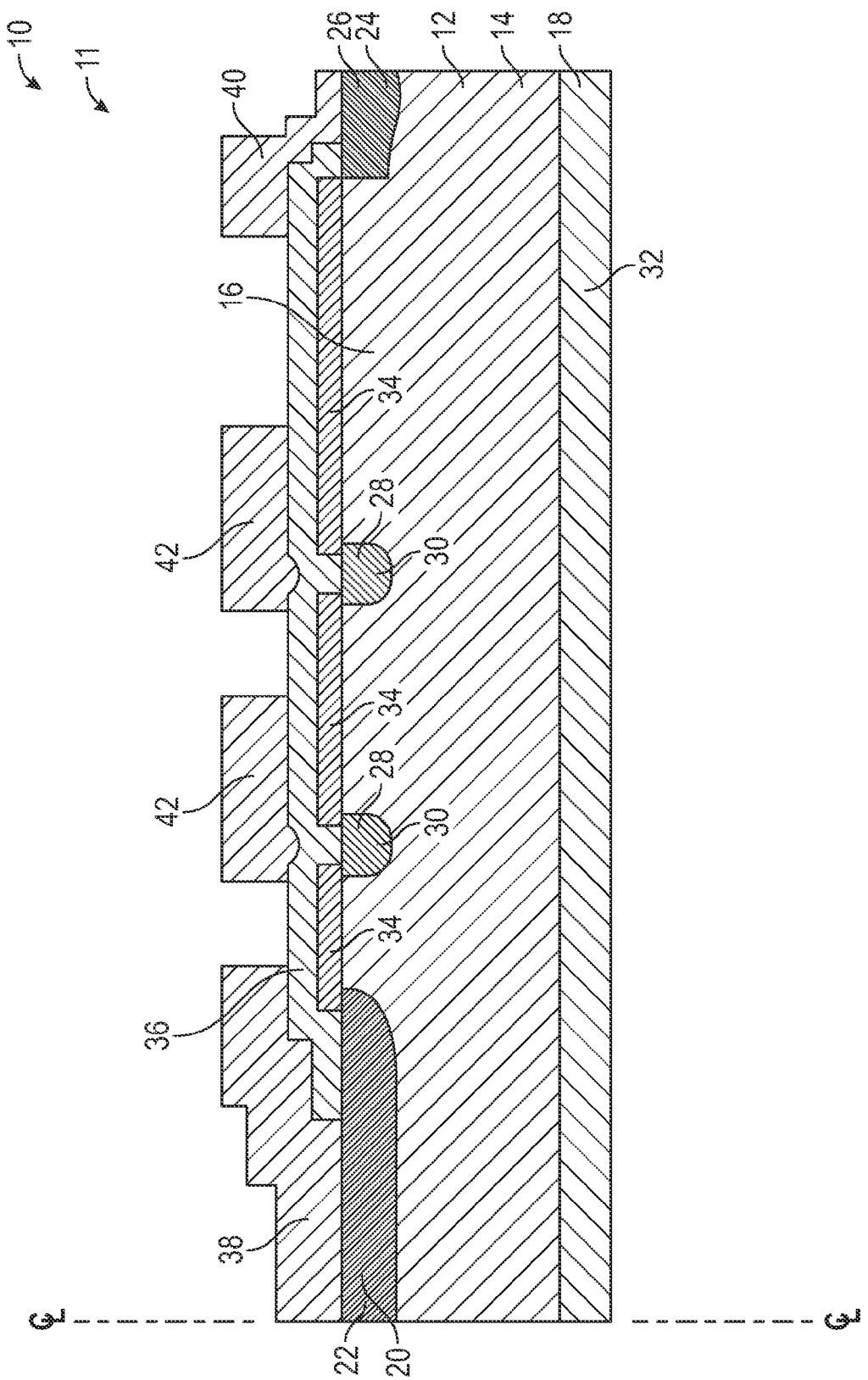
FIGS. 1-4 illustrate, in cross-sectional views, a semiconductor device and methods for fabricating a semiconductor device during various intermediate fabrication stages in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to semiconductor devices including a semiconductor structure and methods for fabricating such semiconductor devices. In an exemplary embodiment, the semiconductor structure is configured as a fast recovery diode structure and includes a doped semiconductor substrate with a central P+ dopant region that defines a main anode, a termination N+ dopant region that defines a channel stop, and a lower N+ dopant region that is formed in a lower surface portion of the doped semiconductor substrate. A first anode metal pad is electrically coupled to the main anode and a second metal structure is electrically coupled to the channel stop. In an exemplary embodiment, at least one oxide layer overlies the doped semiconductor substrate between the first anode metal pad and the second metal structure. An electrically semi-insulating passivation layer overlies the fast recovery diode structure and an electrically substantially fully insulating passivation layer overlies the electrically semi-insulating passivation layer.

In an exemplary embodiment, the semiconductor device is configured such that the main anode and a N− dopant region of the fast recovery diode structure form a P-N junction that has a stable reverse bias breakdown voltage, for example, even in the presence of moisture. In particular and as will be discussed in further detail below, in an exemplary embodiment, when a negative voltage bias is applied to the main anode of the fast recovery diode structure in the presence of relatively high humidity (e.g., relatively high humidity of about 60% or greater relative humidity), the electrically semi-insulating passivation layer and the electrically substantially fully insulating passivation layer cooperate to help reduce, prevent, or eliminate any dormant surface charges on the electrically substantially fully insulating passivation layer from becoming mobile and pooling together to create a localized pocket(s) of an electric field(s) in an undesirable location(s). As such, in an exemplary embodiment, the semiconductor device has a relatively stable reverse bias breakdown voltage for improved performance and reliability even in the presence of moisture.

FIGS. 1-4 illustrate, in cross-sectional views, a semiconductor device 10 during various fabrication stages. The described process steps, procedures, and materials are to be considered only as exemplary embodiments designed to illustrate to one of ordinary skill in the art methods for fabricating semiconductor devices; the methods for fabricating semiconductor devices are not limited to these exemplary embodiments. Various steps in the manufacture of semiconductor devices are well known and so, in the interest of brevity, many conventional steps will only be mentioned briefly herein or will be omitted entirely without providing the well-known process details.

FIG. 1 illustrates a portion of the semiconductor device 10 during an intermediate fabrication stage in accordance with an exemplary embodiment. The semiconductor device 10 includes a semiconductor structure that is configured as a fast recovery diode structure 11. Although the semiconductor structure is configured as a fast recovery diode structure, it is to be appreciated that the semiconductor structure can be configured other than a fast recovery diode structure, such as, a transistor structure or other semiconductor structure, for example, a high-voltage semiconductor structure, such as, a high-voltage transistor structure, for example, an insulated-gate bipolar transistor (IGBT) or the like, or other high-voltage semiconductor structure. The fast recovery diode structure 11 includes a doped semiconductor substrate 12 formed of a semiconductor substrate that may represent any appropriate carrier material, such as silicon or silicon-based materials, and the like. As used herein, the term 'semiconductor substrate' will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. An exemplary semiconductor material is a silicon substrate. The silicon substrate may be a bulk silicon wafer or may be a thin layer of silicon on an insulating layer (commonly known as silicon-on-insulator or SOI) that, in turn, is supported by a carrier wafer.

In an exemplary embodiment, the doped semiconductor substrate 12 is formed of a silicon wafer that has been doped with an appropriate dopant species for establishing an N conductivity type substantially throughout the wafer (indicated by N− dopant region(s) 14). As used herein, the notations "−" and "+" are relative notations that refer to levels of doping in which "−" refers to a lighter doping or lightly doped and comparatively, "+" refers to heavier doping or heavily doped. N type dopant species include elements of group V of the periodic table such as phosphorus (P), arsenic (As), and the like.

As illustrated, the doped semiconductor substrate 12 has an upper surface portion 16 and a lower surface portion 18. A central P+ dopant region 20 that extends to the upper surface portion 16 has been formed by doping with an appropriate dopant species for establishing a P conductivity type. P type dopant species include elements of group III of the periodic table such as boron (B) and the like. The central P+ dopant region 20 defines a main anode 22 for forming a P-N junction as will be discussed in further detail below.

Surrounding the upper surface portion 16 of the doped semiconductor substrate 12 is a termination N+ dopant region 24 that has been formed by further doping with an appropriate N conductivity type dopant species. The termination N+ dopant region 24 defines a channel stop 26 that forms an outer perimeter portion of the fast recovery diode structure 11.

As illustrated, disposed in the upper surface portion 16 of the doped semiconductor substrate 12, between and spaced apart from the main anode 22 and the channel stop 26, is a plurality of intermediate P+ dopant regions 28 that have been formed by doping with an appropriate P conductivity type dopant species. Each of the intermediate P+ dopant regions 28 defines a guard ring 30.

Opposite the upper surface portion 16, the lower surface portion 18 of the doped semiconductor substrate 12 is further doped with an appropriate N conductivity type dopant species to optionally form a lower N+ dopant region 32. In an exemplary embodiment, the main anode 22 forms a P-N junction with N− dopant region 14.

Overlying the doped semiconductor substrate 12 are a patterned oxide layer 34, an oxide layer 36, an anode metal pad 38, a metal structure 40, and metal field plates 42. As illustrated, the anode metal pad 38 is electrically coupled to the main anode 22, the metal structure 40 is electrically coupled to the channel stop 26, and the patterned oxide layer 34 and the oxide layer 36 are disposed between the anode metal pad 38 and the metal structure 40. It is to be appreciated that the oxide layer(s) can be a stack up of oxides or may be one continuous layer of oxide. It is also to be appreciated that the oxide layer(s) can be formed using different methods during the device fabrication. The thickness of the oxide can vary depending on the device being fabricated. In an exemplary embodiment, the metal field plates 42 overlie the oxide layer 36 and are staggered over or generally vertically aligned with the guard rings 30 to help manage a resultant electric field produced from the fast recovery diode structure 11 during operation, such as in a relatively high voltage application (e.g., reverse bias breakdown voltage(s) of about 500 V or greater). In an exemplary embodiment, although not illustrated, the metal field plates 42 can have small contact windows that are patterned through the oxide layers 34 and 36 such that the metal of the metal field plates 42 can directly contact the intermediate P+ dopant regions 28 that form the guard rings 30 that lie beneath the respective metal field plates 42.

In an exemplary embodiment, the patterned oxide layer 34 and the oxide layer 36 are formed of a dielectric oxide material such as silicon oxide (e.g., silicon dioxide ($SiO_2$)). In an exemplary embodiment, the patterned oxide layer 34 has a thickness of from about 7000 to about 10,000 Å and, independently the oxide layer 36 has a thickness of from about 7000 to about 10,000 Å. In an exemplary embodiment, the anode metal pad 38, the metal structure 40, and the metal field plates 42 are formed of a conductive metal material such as aluminum, an aluminum alloy(s), or the like, and independently have a thickness of from about 20,000 to about 50,000 Å.

The illustrated portion of the semiconductor device 10 may be formed on the basis of well-known techniques. In an exemplary embodiment, the semiconductor device 10 is formed by, after providing a silicon wafer that has been lightly doped with an appropriate N conductivity type dopant species, thermally growing an oxide layer on the silicon wafer using, for example, a thermal oxidation process and patterning the oxide layer using, for example, a wet etching process (e.g., hydrochloric (HF) acid etch) to form the patterned oxide layer 34. Next, the central P+ dopant region 20, the termination N+ dopant region 24, the intermediate P+ dopant regions 28, and the lower N+ dopant region 32 are formed using, for example, the patterned oxide layer 34, additional photo masking and lithography techniques, and a plurality of ion implantation processes to selectively implant the various appropriate dopant species into the silicon wafer for establishing the corresponding conductivity types as discussed above. Alternatively, the dopant species can be introduced into the silicon wafer using methods other than ion implantation, such as, for example, a thermal based doping process(es). Next, the oxide layer 36 is deposited using, for example, a chemical vapor deposition (CVD) process and is patterned and etched (e.g., similar to the patterning and etching of the oxide layer 34) followed by the deposition of a metal layer using, for example, a plasma metal deposition process or a physical vapor deposition (PVD) process. The metal layer is then patterned using, for example, lithography and etching techniques to form the anode metal pad 38, the metal structure 40, and the metal field plates 42. Although not illustrated, a backside metal layer as is well-known in the art for fast recovery diodes ("FREDs") may be operatively coupled to the semiconductor device 10.

Figure 2:
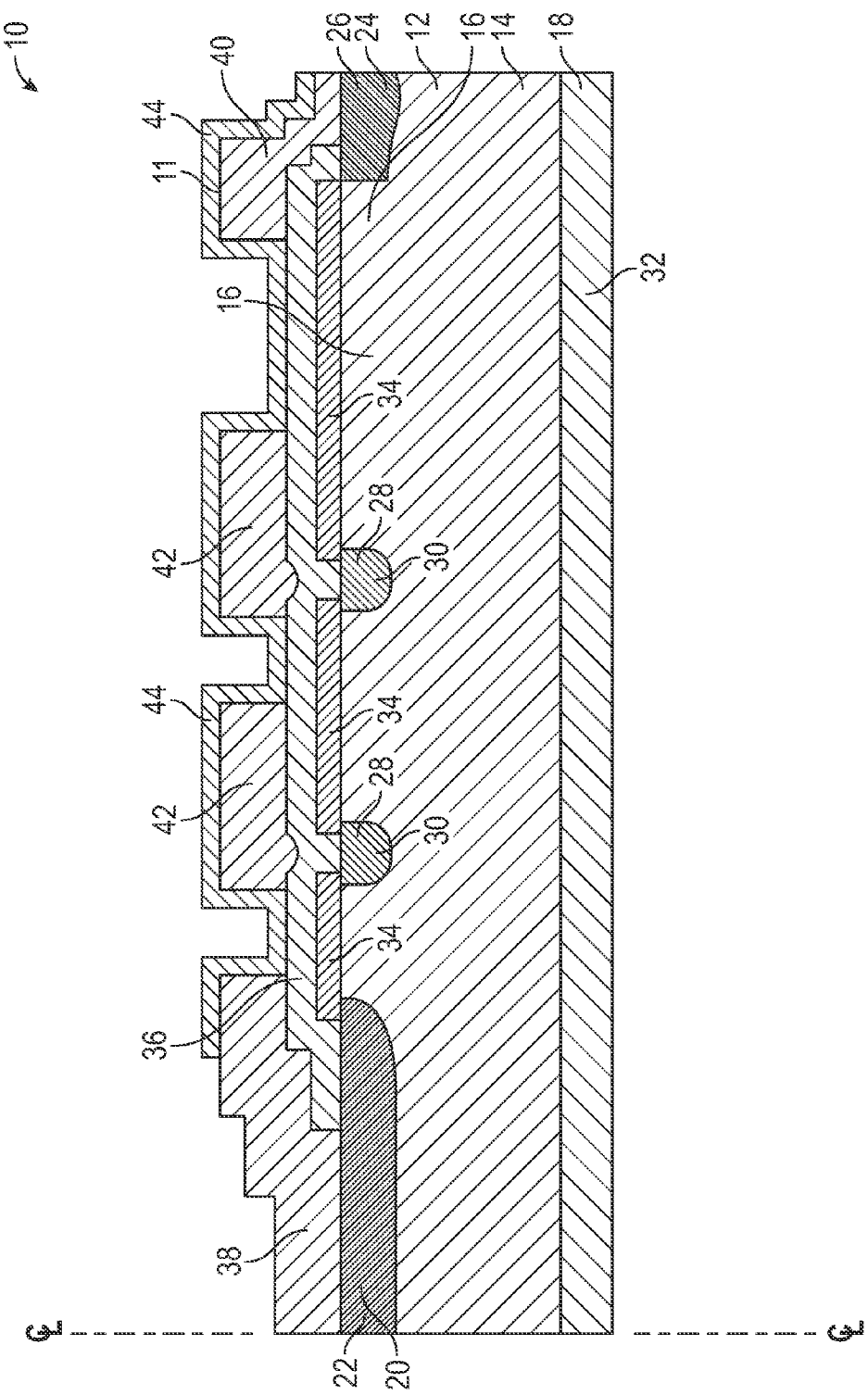

FIG. 2 illustrates the semiconductor device 10 during a further advanced fabrication stage in accordance with an exemplary embodiment. The process continues by forming an electrically semi-insulating passivation layer 44 overlying the fast recovery diode structure 11. As illustrated, the electrically semi-insulating passivation layer 44 is deposited overlying the metal field plates 42, the oxide layer, the metal structure 40, and partially over the anode metal pad 38. In an exemplary embodiment, the electrically semi-insulating passivation layer 44 has a thickness of from about 12,000 to about 20,000 Å, such as from about 15,000 to about 19,000 Å.

The electrically semi-insulating passivation layer 44 is a relatively electrically resistive material but allows for some limited flow of electrical charge(s) (ions). In an exemplary embodiment, the electrically semi-insulating passivation layer 44 has a bulk resistivity of from about $7.5 \times 10^8$ to about $2.5 \times 10^9$ Ohm·cm, such as from about $1 \times 10^9$ to about $2 \times 10^9$ Ohm·cm, independently a low frequency power of from about 450 to about 650 W at about 225 kHz to about 450 kHz, such as from about 500 to about 600 W at about 230 kHz to about 250 kHz, and independently a high frequency power of from about 0 to about 300 W at 13.56 MHz, such as about 0 W at 13.56 MHz. In an exemplary embodiment, the electrically semi-insulating passivation layer 44 has an index of refraction of from about 2.75 to about 3.25, such as from about 2.9 to about 3.1, and independently a film stress of from about $-1 \times 10^{10}$ to about $-2.5 \times 10^9$ Dynes/cm$^2$, such as from about $-7.5 \times 10^9$ to about $-3.5 \times 10^9$ Dynes/cm$^2$.

In an exemplary embodiment, the electrically semi-insulating passivation layer 44 is a silicon nitride material with a nitrogen to silicon (N/Si) molar ratio of from about 0.3 to about 0.38 Y. In an exemplary embodiment, the electrically semi-insulating passivation layer 44 is deposited using a plasma enhanced chemical vapor deposition (PECVD) process with a feed of ammonia ($NH_3$) and silane ($SiH_4$) at an ammonia to silane gas ratio of from about 0.8:1 to about 1.25:1, such as from about 0.85:1 to about 1.15:1, for example about 1:1. In an exemplary embodiment, the PECVD process includes using a $NH_3$ gas flow rate of from about 620 to about 780 sccm, for example from about 650 to about 750 sccm, and a silane gas flow rate of from about 620 to about 780 sccm, for example from about 650 to about 750 sccm. In an exemplary embodiment, the electrically semi-insulating passivation layer 44 is deposited via the PECVD process at a temperature of from about 340 to about 410° C., for example about 390 to about 410° C. and independently, at a pressure of about 2 to about 3 torr, for example from about 2.2 to about 2.7 torr.

Figure 3:
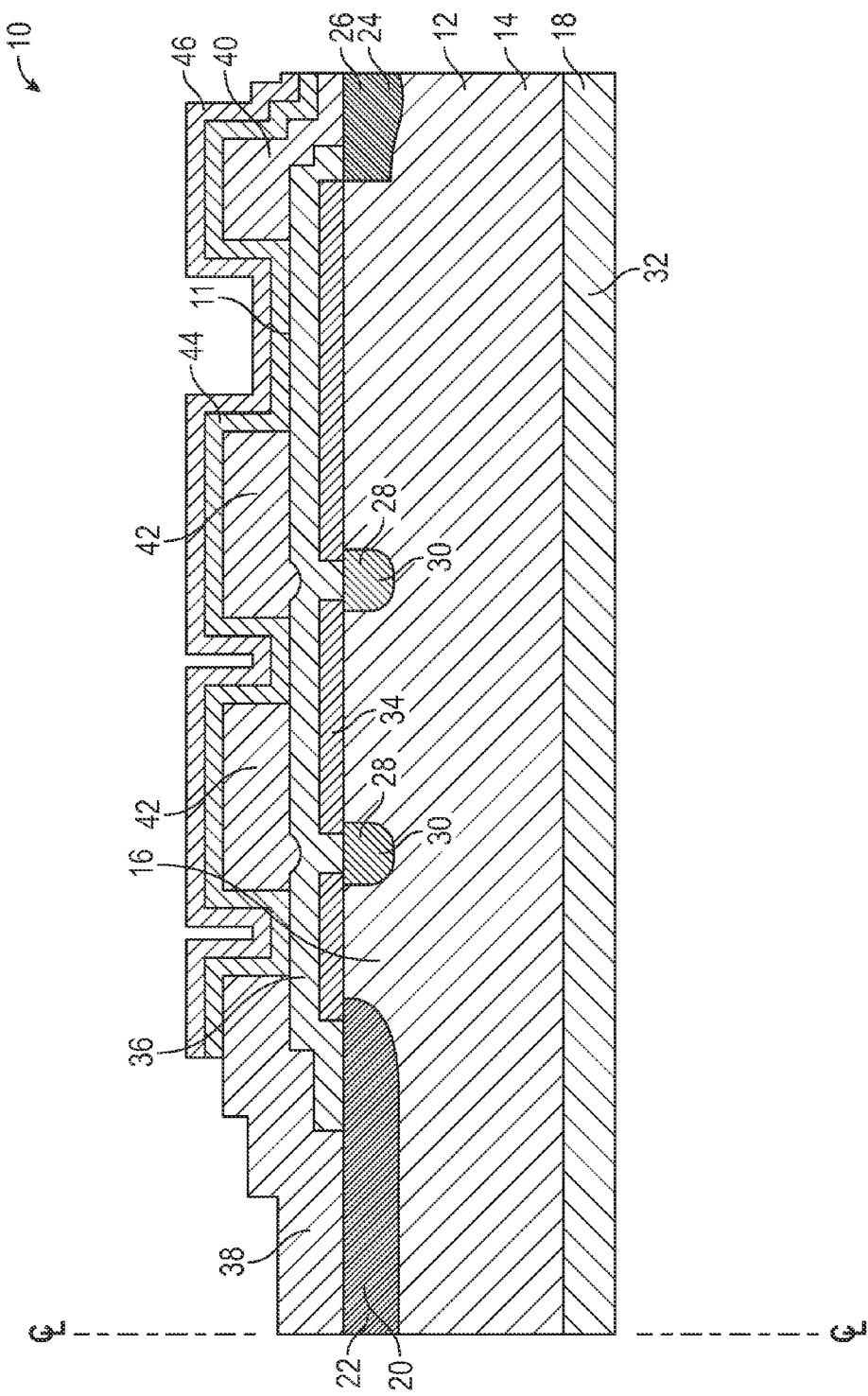

FIG. 3 illustrates the semiconductor device 10 during a further advanced fabrication stage in accordance with an exemplary embodiment. The process continues by forming an electrically substantially fully insulating passivation layer 46 overlying the electrically semi-insulating passivation layer 44. In an exemplary embodiment, the electrically substantially fully insulating passivation layer 46 has a thickness of from about 6,500 to about 10,500 Å, such as from about 7,500 to about 9,500 Å.

The electrically substantially fully insulating passivation layer 46 is a fully or near fully electrically insulating material. In an exemplary embodiment, the electrically substantially fully insulating passivation layer 46 has a bulk resistivity of from about $1 \times 10^{15}$ to about $1 \times 10^{16}$ Ohm·cm, such as from about $3 \times 10^{15}$ to about $7 \times 10^{15}$ Ohm·cm, independently a low frequency power of from about 550 to about 750 W at about 225 kHz to about 450 kHz, such as from about 600 to about 700 W at about 230 kHz to about 250 kHz, and independently a high frequency power of from about 350 to about 550 W at 13.56 MHz, such as from about 400 to about 500 W at 13.56 MHz. In an exemplary embodiment, the electrically substantially fully insulating passivation layer 46 has an index of refraction of from about 1.92 to about 2.08, such as from about 1.97 to about 2.03, and independently a film stress of from about $-6 \times 10^9$ to about $-3 \times 10^8$ Dynes/cm$^2$, such as from about $-3 \times 10^9$ to about $-6 \times 10^8$ Dynes/cm$^2$.

In an exemplary embodiment, the electrically substantially fully insulating passivation layer 46 is a silicon nitride material with a nitrogen to silicon (N/Si) molar ratio of from about 0.9 to about 1.1. In an exemplary embodiment, the electrically substantially fully insulating passivation layer 46 is deposited using a PECVD process with a feed of ammonia (NH$_3$) and silane (SiH$_4$) at an ammonia to silane gas ratio of from about 4.5:1 to about 8.2:1, such as from about 5.1:1 to about 7.1. In an exemplary embodiment, the PECVD process includes using a NH$_3$ gas flow rate of from about 1550 to about 1950 sccm, for example from about 1650 to about 1850 sccm, a silane gas flow rate of from about 240 to about 340 sccm, for example from about 260 to about 320 sccm, and a nitrogen gas flow rate of from about 800 to about 1200 sccm, for example from about 900 to about 1100 sccm. In an exemplary embodiment, the electrically substantially fully insulating passivation layer 46 is deposited via the PECVD process at a temperature of from about 380 to about 420° C., for example about 390 to about 410° C. and independently, at a pressure of about 2.3 to about 3.1 torr, for example from about 2.45 to about 2.95 torr. It is to be appreciated that the stack up of the electrically semi-insulating passivation and the electrically substantially fully insulating passivation layer and the subsequent patterning of these passivation layers may be done in one pass or in two separate passes (or multiple passes) during the fabrication of such a semiconductor device.

Figure 4:
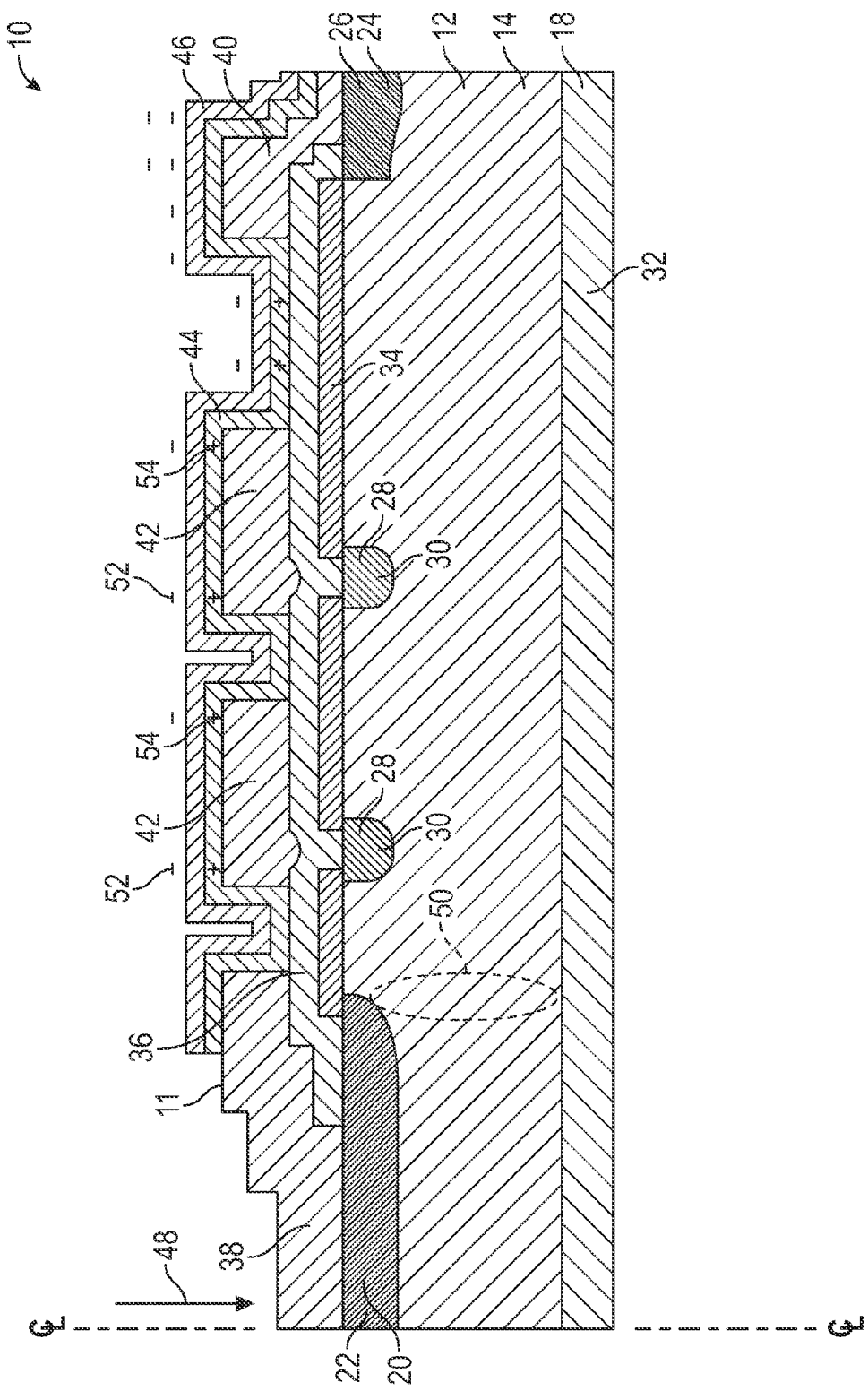

FIG. 4 illustrates the semiconductor device 10 as depicted in FIG. 3 but with a negative voltage bias (indicated by single headed arrow 48) applied to the main anode metal pad 38 of the fast recovery diode structure 11 in the presence of moisture (e.g., relatively high humidity of about 60% or greater relative humidity). In an exemplary embodiment, the fast recovery diode structure 11 is a relatively high voltage fast recovery diode structure having a reverse bias breakdown voltage of about 500 V or greater, such as about 700 V or greater, such as about 1000 V or greater, such as about 1200 V or greater, for example about 1200 to about 2,000 V.

As illustrated, the negative voltage bias 48 is applied to the anode metal pad 38 while the semiconductor device 10 is being exposed to moisture (e.g., relatively high humidity of about 60% or greater relative humidity) and an avalanche breakdown (indicated by dashed lines 50) occurs between the main anode 22 and the N– dopant region(s) along the intended P-N junction to provide a stable reverse bias breakdown voltage. In particular, in an exemplary embodiment, when the negative voltage bias 48 is applied to the main anode metal pad 38 in the presence of relatively high humidity of about 60% or greater relative humidity, dormant surface charges 52 or ions on the surface of the electrically substantially fully insulating passivation layer 46 are substantially held in place by countercharges 54 or ions in the electrically semi-insulating passivation layer 44 that have been drawn from direct contact with the anode metal pad 38, the metal structure 40, and the metal field plates 42 to help reduce, prevent, or eliminate the dormant surface charges 52 from becoming mobile and pooling together to create a localized pocket(s) of an electric field(s) in an undesirable location(s), such as proximate the channel stop 26. As such, in an exemplary embodiment, the semiconductor device 10 has a relatively stable reverse bias breakdown voltage for improved performance and reliability even in the presence of moisture.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A semiconductor device comprising:
a semiconductor structure;
an electrically semi-insulating passivation layer overlying the semiconductor structure, the electrically semi-insulating passivation layer comprising a silicon nitride material having a nitrogen to silicon ratio of between 0.3 to 0.38; and
an electrically substantially fully insulating passivation layer overlying the electrically semi-insulating passivation layer, the electrically substantially fully insulating passivation layer comprising a silicon nitride material having a nitrogen to silicon ratio of between 0.9 to 1.1.

2. The semiconductor device of claim 1, wherein the electrically semi-insulating passivation layer has a thickness of from about 12,000 to about 20,000 Å.

3. The semiconductor device of claim 1, wherein the electrically substantially fully insulating passivation layer has a thickness of from about 6500 to about 10,500 Å.

4. The semiconductor device of claim 1, wherein the electrically semi-insulating passivation layer has a bulk resistivity of from about $7.5 \times 10^8$ to about $2.5 \times 10^9$ Ohm·cm.

5. The semiconductor device of claim 1, wherein the electrically substantially fully insulating passivation layer has a bulk resistivity of from about $1 \times 10^{15}$ to about $1 \times 10^{16}$ Ohm·cm.

6. The semiconductor device of claim 1, wherein the electrically semi-insulating passivation layer has an index of refraction of from about 2.75 to about 3.25.

7. The semiconductor device of claim 1, wherein the electrically substantially fully insulating passivation layer has an index of refraction of from about 1.92 to about 2.08.

8. The semiconductor device of claim 1, wherein the electrically semi-insulating passivation layer has a low frequency power of from about 450 to about 650 W at about 225 to about 450 kHz.

9. The semiconductor device of claim 1, wherein the electrically substantially fully insulating passivation layer has a low frequency power of from about 550 to about 750 W at about 225 to about 450 kHz.

10. The semiconductor device of claim 1, wherein the electrically semi-insulating passivation layer has a high frequency power of from about 0 to about 300 W at 13.56 MHz.

11. The semiconductor device of claim 1, wherein the electrically substantially fully insulating passivation layer has a high frequency power of from about 350 to about 550 W at 13.56 MHz.

12. The semiconductor device of claim 1, wherein the electrically semi-insulating passivation layer has a film stress of from about $-1 \times 10^{10}$ to about $-2.5 \times 10^9$ Dynes/cm2.

13. The semiconductor device of claim 1, wherein the electrically substantially fully insulating passivation layer has a film stress of from about $-6 \times 10^9$ to about $-3 \times 10^8$ Dynes/cm2.

14. The semiconductor device of claim 1, wherein the semiconductor structure is a high voltage fast recovery diode structure having a reverse bias breakdown voltage of about 500 to about 2000 V.

15. A semiconductor device comprising:
- a semiconductor structure configured as fast recovery diode structure and comprising:
  - a doped semiconductor substrate of an N conductivity type and having an upper surface portion and a lower surface portion that is disposed on a side opposite the upper surface portion, wherein the doped semiconductor substrate comprises:
    - a central P+ dopant region of a P conductivity type extending to the upper surface portion defining a main anode;
    - a termination N+ dopant region of the N conductivity type surrounding the upper surface portion defining a channel stop;
    - at least one intermediate P+ dopant region of the P conductivity type disposed in the upper surface portion between and spaced apart from the main anode and the channel stop defining at least one guard ring; and
    - a lower N+ dopant region of the N conductivity type formed in the lower surface portion of the doped semiconductor substrate;
  - a first anode metal pad electrically coupled to the main anode;
  - a second metal structure electrically coupled to the channel stop;
  - at least one oxide layer overlying the doped semiconductor substrate between the first anode metal pad and the second metal structure; and
  - at least one metal field plate disposed between and spaced apart from the first anode metal pad and the second metal structure overlying the at least one oxide layer;
- an electrically semi-insulating passivation layer comprising a first silicon nitride material overlying the at least one metal field plate and the at least one oxide layer, wherein the first silicon nitride material has a first bulk resistivity of from about $7.5 \times 10^8$ to about $2.5 \times 10^9$ Ohm·cm, wherein the electrically semi-insulating passivation layer comprises has a nitrogen to silicon ratio of between 0.3 to 0.38; and
- an electrically substantially fully insulating passivation layer comprising a second silicon nitride material overlying the electrically semi-insulating passivation layer, wherein the second silicon nitride material has a second bulk resistivity of from about $1 \times 10^{15}$ to about $1 \times 10^{16}$ Ohm·cm, wherein the electrically substantially fully insulating passivation layer comprises a silicon nitride material having a nitrogen to silicon ratio of between 0.9 to 1.1.

16. A method for fabricating a semiconductor device, the method comprising the steps of:
- forming an electrically semi-insulating passivation layer overlying a semiconductor structure, the electrically semi-insulating passivation layer comprising a silicon nitride material having a nitrogen to silicon ratio of between 0.3 to 0.38; and
- forming an electrically substantially fully insulating passivation layer overlying the electrically semi-insulating passivation layer, the electrically substantially fully insulating passivation layer comprising a silicon nitride material having a nitrogen to silicon ratio of between 0.9 to 1.1.

17. The method of claim 16, wherein forming the electrically semi-insulating passivation layer comprises depositing the silicon nitride material overlying the semiconductor structure using a plasma enhanced chemical vapor deposition (PECVD) process and an ammonia to silane gas ratio of from about 0.8:1 to about 1.25:1.

18. The method of claim 17, wherein depositing the silicon nitride material comprises depositing the silicon nitride material at a temperature of from about 340 to about 410° C.

19. The method of claim 16, wherein forming the electrically substantially fully insulating passivation layer comprises depositing a silicon nitride material overlying the electrically semi-insulating passivation layer using a plasma enhanced chemical vapor deposition (PECVD) process and an ammonia to silane gas ratio of from about 4.5:1 to about 8.2:1.

20. The method of claim 19, wherein depositing the silicon nitride material comprises depositing the silicon nitride material at a temperature of from about 380 to about 420° C.

* * * * *